(12) United States Patent
Sekiguchi

(10) Patent No.: US 7,852,894 B2
(45) Date of Patent: Dec. 14, 2010

(54) SEMICONDUCTOR LASER AND SEMICONDUCTOR OPTICAL INTEGRATED DEVICE

(75) Inventor: Shigeaki Sekiguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/199,099

(22) Filed: Aug. 27, 2008

(65) Prior Publication Data
US 2009/0059988 A1    Mar. 5, 2009

(30) Foreign Application Priority Data
Sep. 4, 2007    (JP)    ............................. 2007-229425

(51) Int. Cl.
*H01S 5/00*    (2006.01)
(52) U.S. Cl. .................. 372/50.11; 372/43.01; 372/96; 372/102
(58) Field of Classification Search ............... 372/50.11
See application file for complete search history.

(56) References Cited

U.S. PATENT DOCUMENTS

| | | | | |
|---|---|---|---|---|
| 5,170,402 | A | * | 12/1992 | Ogita et al. .................. 372/20 |
| 5,777,792 | A | * | 7/1998 | Okada et al. ................. 359/584 |
| 7,130,124 | B2 | * | 10/2006 | Ketterson et al. ........... 359/569 |

FOREIGN PATENT DOCUMENTS

| | | |
|---|---|---|
| JP | 63-299390 A | 12/1988 |
| JP | 63299390 | * 12/1988 |
| JP | 4-100287 A | 4/1992 |
| JP | 4-330793 A | 11/1992 |
| JP | 06-196799 | 7/1994 |
| JP | 2687526 B2 | 12/1997 |

OTHER PUBLICATIONS

Soda, H. et al.; "Stability in Single Longitudinal Mode Operation in GaInAsP/InP Phase-Adjusted DFB Lasers"; IEEE Journal of Quantum Electronics, vol. QE-23, No. 6, pp. 804-814; Jun. 1987.
Japanese Office Action dated Aug. 11, 2009, issued Japanese Patent Application No. 2007-229425.
Japanese Office Action mailed by JPO and corresponding to Japanese application No. 2007-229425 on May 25, 2010, with English translation.

* cited by examiner

*Primary Examiner*—Minsun Harvey
*Assistant Examiner*—Xnning Niu
(74) *Attorney, Agent, or Firm*—Fujitsu Patent Center

(57) ABSTRACT

A semiconductor laser includes an optical waveguide formed on a semiconductor substrate and capable of generating gain by current injection, and a diffraction grating having a phase shift and provided along the optical waveguide over the overall length of the optical waveguide on the semiconductor substrate. The semiconductor laser is configured such that a Bragg wavelength in a region in the proximity of each of the opposite ends of the optical waveguide is longer than a Bragg wavelength in a region in the proximity of the phase shift in a state in which current injection is not performed for the optical waveguide.

18 Claims, 13 Drawing Sheets d2−d1∼0.1 μm

SEMICONDUCTOR LASER AND SEMICONDUCTOR OPTICAL INTEGRATED DEVICE

CROSS REFERENCE TO RELATED APPLICATIONS

This application is based on and hereby claims priority to Japanese Application No. 2007-229425 filed on Sep. 4, 2007 in Japan, the contents of which are hereby incorporated by reference.

TECHNICAL FIELD

This invention relates to a semiconductor laser and a semiconductor optical integrated device.

BACKGROUND

A semiconductor laser for a light source to be used for optical communication is demanded to oscillate stably with a single wavelength. Further, from a point of view of low power consumption, also it is demanded for the semiconductor laser to have low oscillation threshold current.

Conventionally, as a semiconductor laser which oscillates stably with a single wavelength, a distributed feedback (DFB) laser having a phase shift is used.

In a phase shift DFB laser, in order to implement low threshold value operation, the coupling coefficient (diffraction strength) of a diffraction grating is set high so that great feedback is obtained.

However, where, as shown in FIG. 1(A), a phase shift (here, a $\lambda/4$ phase shift) 11 is provided at the center of a diffraction grating 10 of a DFB laser, if the coupling coefficient is set to a great value, then concentration of light intensity (photoelectric field intensity) occurs in the proximity of the phase shift 11 as seen in FIG. 1(B) and the stimulated emission rate in the proximity of the phase shift 11 becomes high as a result of high light intensity and electron-hole pairs (carriers) decrease.

As a result, the carrier density becomes comparatively low in the proximity of the phase shift 11 while the carrier density increases at end portions of the diffraction grating 10 as seen in FIG. 1(C), resulting in non-uniformity of the carrier density.

Here, the carrier density has, by a plasma effect thereof, an influence on the refractive index (waveguide refractive index) of a semiconductor material of which an optical waveguide of a laser is made.

Therefore, if non-uniformity of the carrier density appears, then non-uniformity of the waveguide refractive index appears. In particular, since the carrier density is low in the proximity of the phase shift 11, the waveguide refractive index is high, but, since the carrier density is high at the end portions of the diffraction grating 10, the waveguide refractive index is low.

Such a difference of the waveguide refractive index as just described is equal to that of the optical length of the optical waveguide and has an influence on the Bragg wavelength. In particular, since the refractive index is high in the proximity of the phase shift 11 as seen in FIG. 1(D), the optical length becomes long and the wavelength of the Bragg wavelength becomes long. However, at the end portions, since the refractive index is low, the optical length becomes short and the Bragg wavelength becomes short.

As a result, the Bragg wavelengths do not coincide in the resonator. Therefore, if the injection current value is increased so that a desired optical output is obtained, then the oscillation spectrum of the laser degrades and stable single-mode operation (single-wavelength operation) cannot be implemented any more. Such a phenomenon as just described is called spatial hole burning (for example, refer to Soda et al., "Stability in Single Longitudinal Mode Operation in GaInAsP/InP Phase-Adjusted DFB Lasers", IEEE Journal of Quantum Electronics, vol. QE-23, No. 6, June 1987, pp. 804-814).

Here, FIG. 2 illustrates oscillation spectrums where the injection current value is successively increased like 7 mA, 10 mA, 20 mA, 40 mA, 60 mA, 80 mA, and 100 mA (the injection current value is greater on the upper side in FIG. 2).

As seen in FIG. 2, it is recognized that, if the injection current value is increased so that a desired optical output is obtained, then light intensity increases and multi-mode oscillation occurs, and as a result, single-mode operation cannot be implemented anymore.

SUMMARY

The embodiment provides that a semiconductor laser including an optical waveguide formed on a semiconductor substrate and capable of generating gain by current injection, and a diffraction grating having a phase shift and provided along the optical waveguide over the overall length of the optical waveguide on the semiconductor substrate, wherein the semiconductor laser is configured such that a Bragg wavelength in a region in the proximity of each of the opposite ends of the optical waveguide is longer than a Bragg wavelength in a region in the proximity of the phase shift in a state in which current injection is not performed for the optical waveguide.

The embodiment provides that a semiconductor optical integrated device including a semiconductor laser described above, and an optical functional device provided on the semiconductor substrate on which the semiconductor laser is formed and optically coupled to the semiconductor laser.

DESCRIPTION OF THE EMBODIMENTS

In the following, a semiconductor laser and a semiconductor optical integrated device according to embodiments are described with reference to the drawings.

First Embodiment

First, a semiconductor laser according to a first embodiment is described with reference to FIGS. 3 to 8.

Figure 3:
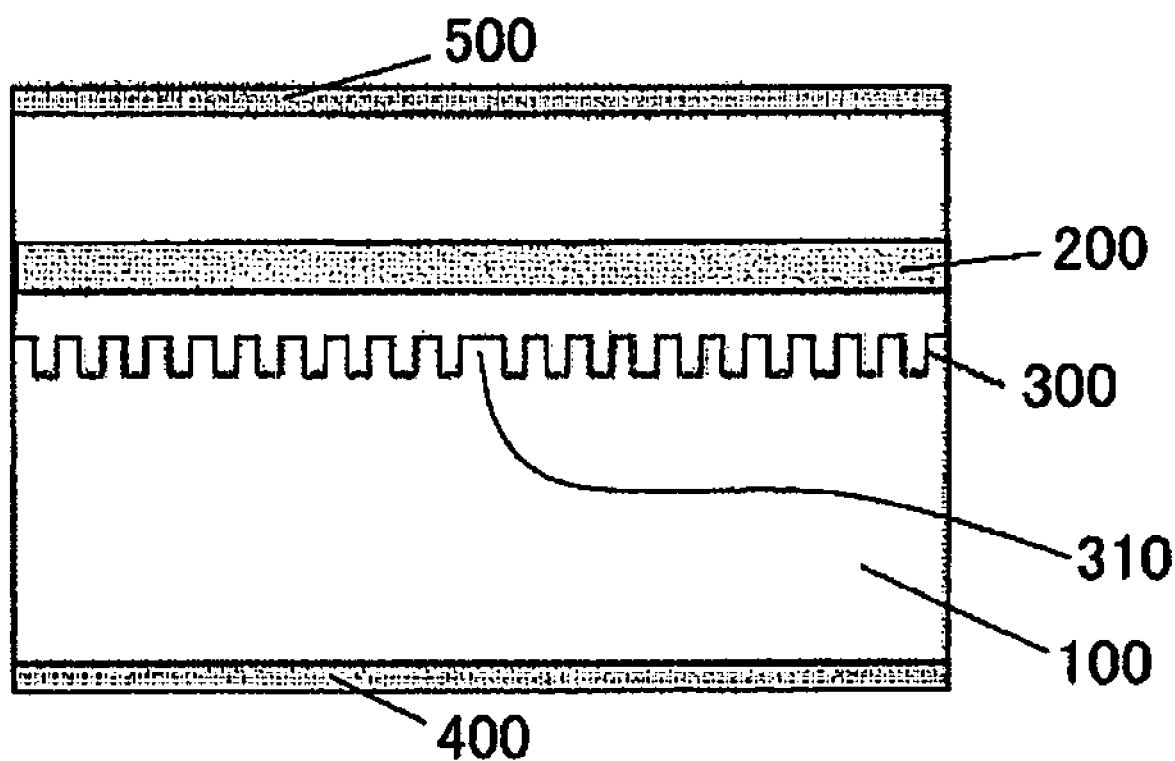
FIG. 3 is a schematic sectional view showing a configuration of a semiconductor laser according to a first embodiment.

For example, as shown in FIG. 3, the semiconductor laser (semiconductor device) according to the embodiment includes an optical waveguide (optical waveguide structure; this includes, for example, a waveguide core layer formed from a multiple quantum well structure of GaInAsP) 200 capable of generating gain by current injection and a diffraction grating (successive diffraction grating structure for applying perturbation to the optical waveguide 200) 300 provided along the optical waveguide 200 over the overall length of the optical waveguide 200. The optical waveguide 200 and the diffraction grating 300 are formed on a semiconductor substrate (here, n-type InP substrate) 100. Further, an electrode 500 is provided at an upper portion of the optical waveguide 200, and an electrode 400 is provided at a lower portion of the semiconductor substrate 100.

Here, in the diffraction grating 300, one phase shift (here, λ/4 phase shift) 310 is provided at a central position (resonator central position). In particular, the diffraction grating 300 has the phase shift 310 at the one position of the center thereof, and the amount of the phase shift of the phase shift 310 is a ¼ wavelength. In particular, this semiconductor laser is a distributed feedback laser (DFB laser) having the phase shift 310.

Incidentally, several methods for avoiding a spatial hole burning phenomenon are available.

For example, a method is available wherein a phase shift is not implemented by a diffraction grating but is implemented by reducing the equivalent refractive index of a waveguide in the proximity of the center of a resonator so that spatial hole burning in an axial direction is suppressed (hereinafter referred to as first method). In this method, in comparison with the alternative case wherein the phase shift is implemented by a diffraction grating, the concentration of the photoelectric field strength is moderated so that the wavelength stability may not deteriorate very much while hole burning occurs.

Further, a method is available wherein the coupling coefficient (coupling constant) a diffraction grating is decreased in the proximity of the center of a resonator to flatten the photoelectric field intensity thereby to suppress hole burning (hereinafter referred to as second method).

However, with the first method described above, a higher threshold value is exhibited in comparison with the ideal phase shift. Further, it is necessary to achieve optimization of a production condition such that a phase reverse occurs in a region for decreasing the equivalent refractive index in the proximity of the center of the resonator, and setting of the condition and the production are not easy.

Further, with the second method described above, since the coupling coefficient is varied in the inside of the resonator, such a complicated step that the depth of the diffraction grating and the line and space ratio are varied in the resonator is required. Further, since a portion at which the coupling coefficient is decreased is provided, the threshold value increases.

Therefore, it is desired that, also where the injection current value is increased so that a desired optical output is obtained, stabilized single-wavelength operation and stabilized low-threshold value operation can be implemented.

In the embodiment, the semiconductor laser is configured such that, in a state in which current injection is not performed for the optical waveguide 200, the Bragg wavelength in regions in the proximity of the opposite ends (the opposite ends of the device; the opposite ends of the resonator) of the region in which the diffraction grating 300 is provided (regions having a desired length from an end) is longer than the Bragg wavelength in a region in the proximity of the phase shift 310 (region adjacent to the phase shift 310).

Particularly, in the embodiment, the semiconductor laser is configured such that, in a state in which current injection to the optical waveguide is not performed, the Bragg wavelength varies stepwise.

Figure 4:
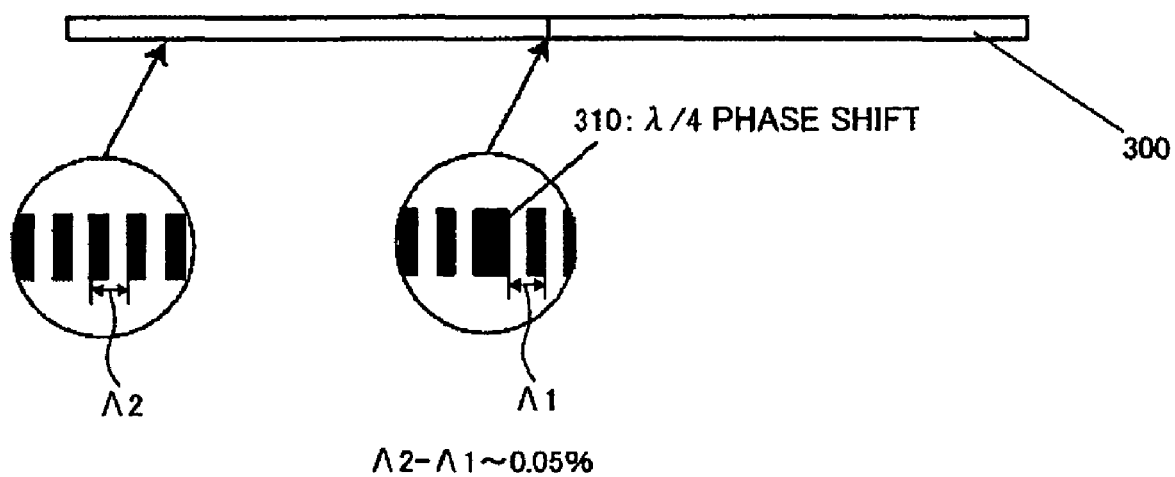
FIG. 4 is a schematic view showing a configuration of main part of the semiconductor laser according to the first embodiment.

In particular, as shown in FIG. 4, the period Λ2 of the diffraction grating 300 provided in the region in the proximity of the opposite end portions is longer by 0.05% than the period Λ1 of the diffraction grating 300 provided in the region in the proximity of the phase shift 310. It is to be noted that the period Λ1 of the diffraction grating 300 provided in the region in the proximity of the phase shift 310 is set to correspond to a desired Bragg wavelength (here, 1550 nm).

Figure 5A:
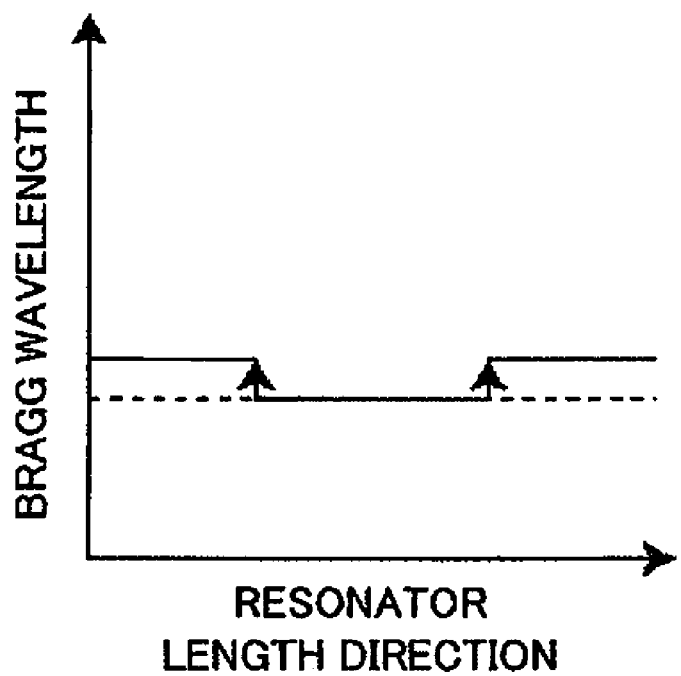
FIG. 5(A) is a view showing a Bragg wavelength in a state in which current injection to the semiconductor laser according to the first embodiment is not performed.

Consequently, as shown in FIG. 5(A), in the state in which current injection to the optical waveguide 200 is not performed, the Bragg wavelength in the region in the proximity of the opposite end portions (the Bragg wavelength depending upon the configuration of the optical waveguide 200 and diffraction grating 300 in the regions in the proximity of the opposite end portions) becomes longer by 0.05% than the Bragg wavelength in the region in the proximity of the phase shift 310 (the Bragg wavelength depending upon the configuration of the optical waveguide and the diffraction grating in the region in the proximity of the phase shift 310).

Here, the overall length of the laser (device length; resonator length) is 600 μm, and the lengths of the regions in the proximity of the opposite end portions (here, the lengths of the regions in which the period of the diffraction grating 300 is Λ2; regions wherein the period of the diffraction grating 300 is long) are individually 100 μm from the individual end portions.

Figure 6:
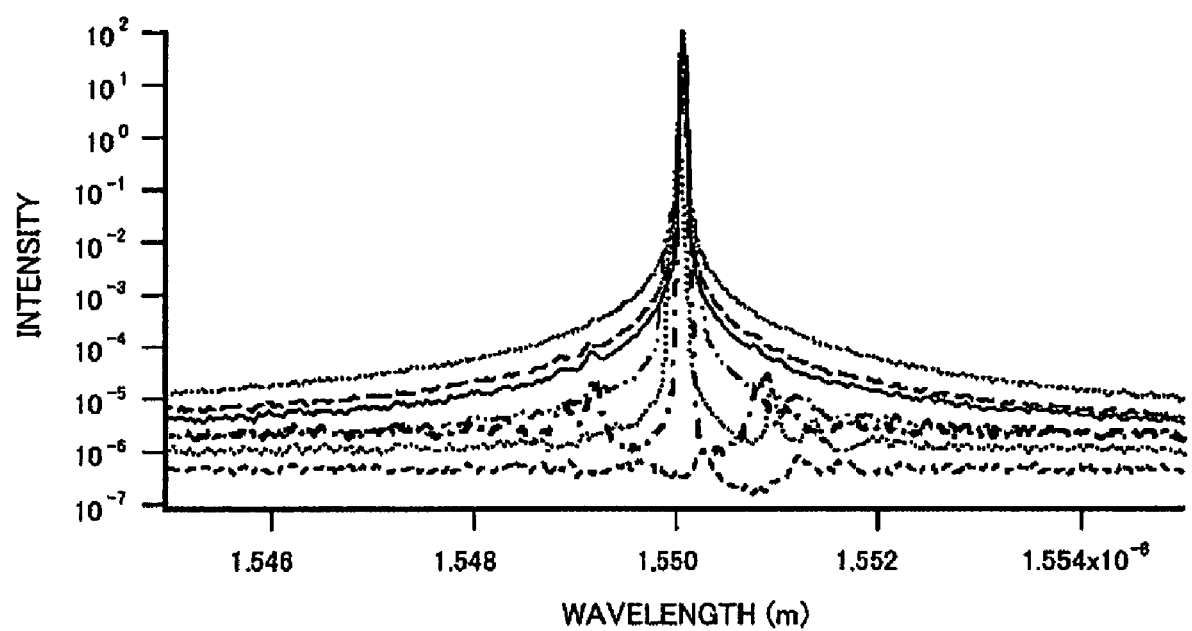
FIG. 6 is a view illustrating oscillation spectrums for different injection current values of the semiconductor laser according to the first embodiment.

Here, FIG. 6 shows oscillation spectrums where, in the semiconductor laser configured in such a manner as described above, the injection current value is increased successively like 7 mA, 10 mA, 20 mA, 40 mA, 60 mA, 80 mA, and 100 mA (injection current value is greater on the upper side in FIG. 6).

As seen in FIG. 6, it is recognized that, also where the injection current value is increased to increase the light intensity so that a desired optical output may be obtained, multimode oscillation does not occur and stabilized single-wavelength oscillation (single-mode oscillation) is obtained. It is to be noted that, in this case, the threshold value is similar to that of a normal phase shift DFB laser and low-threshold value operation can be implemented.

Accordingly, with the semiconductor laser according to this embodiment, there is an advantage that, also where the injection current value is increased so that a desired optical output is obtained, stabilized single-wavelength operation and stabilized low-threshold value operation can be implemented.

Figure 1A:
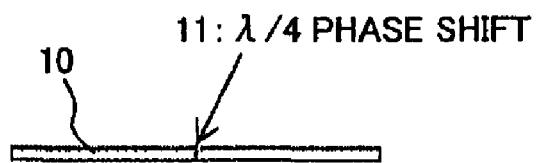
FIGS. 1(A) to 1(D) are views illustrating a subject to be solved by the embodiment.
Figure 1B:
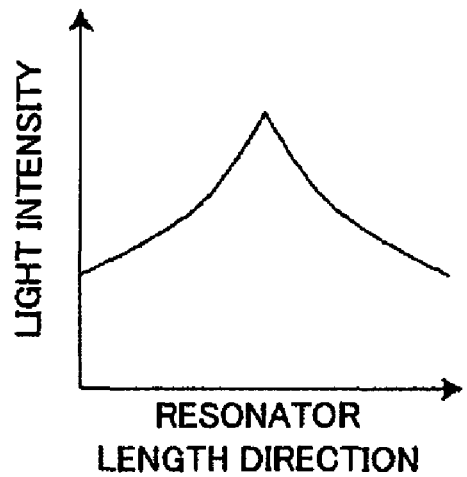
Figure 1C:
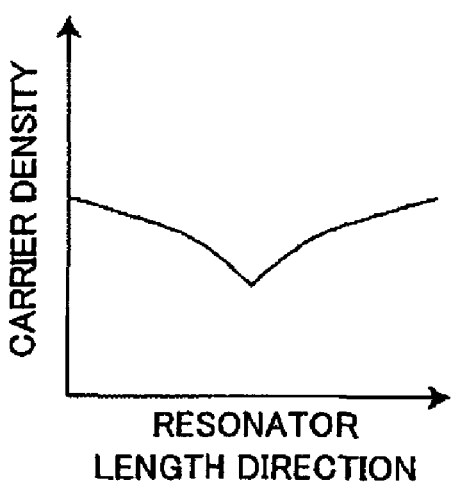
Figure 1D:
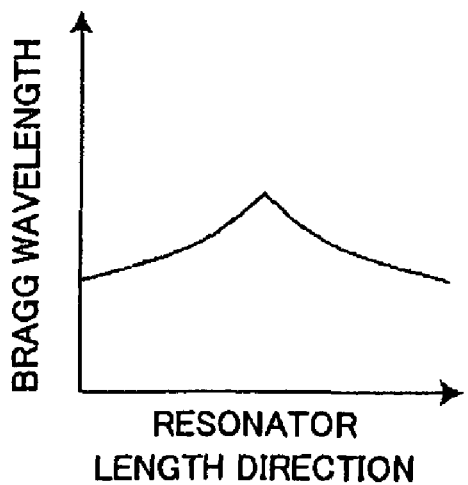
Figure 2:
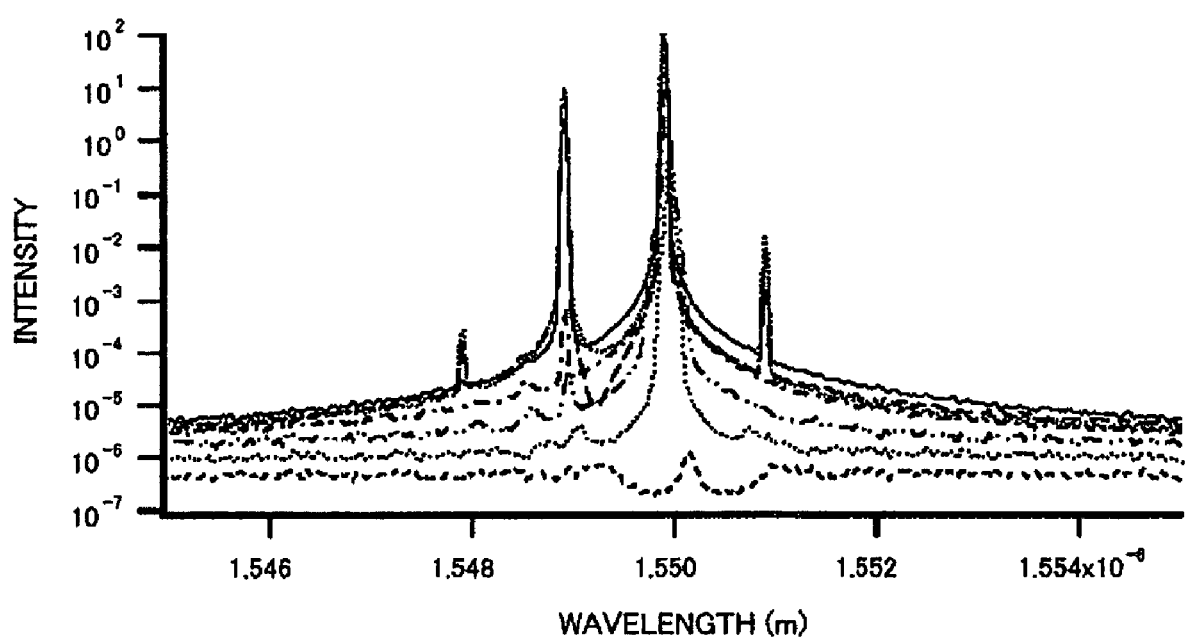
FIG. 2 is a view illustrating the subject to be solved by the embodiment.
Figure 5B:
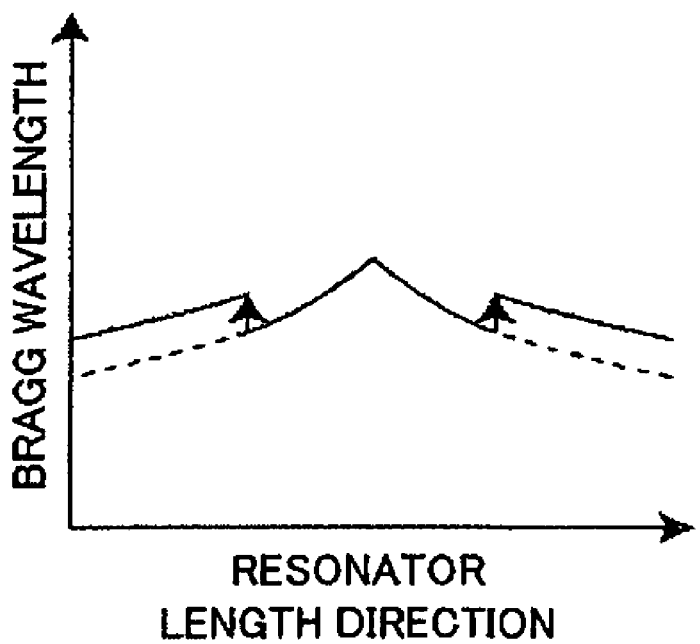
FIG. 5(B) is a view showing a Bragg wavelength in another state in which the current injection is performed.

In particular, with this semiconductor laser, even if concentration of the light intensity (photoelectric field intensity) appears in the proximity of the phase shift [refer to FIG. 1(B)] and the Bragg wavelength in the region in the proximity of the phase shift becomes long [refer to FIG. 1(D)], since the Bragg wavelength in the regions in the proximity of the opposite end portions in the state in which current injection is not performed for the optical waveguide 200 is offset to the long wavelength side as shown in FIG. 5(A), the Bragg wavelength is placed into a state in which it is substantially constant over the overall length in the inside of the resonator, and stabilized single-wavelength operation is obtained as seen in FIG. 5(B). Further, since the threshold value is substantially equal to a minimum value in the state in which the Bragg wavelength is substantially uniformized in this manner, low-threshold value operation is obtained.

It is to be noted that, while, in this embodiment, the device length is set to 600 μm and the length of the regions (regions in the proximity of the opposite end portions) wherein the period of the diffraction grating 300 is long is set to 100 μm as described above, this embodiment is not limited to this. For example, even if the device length and the region length are different from those just described or the ratio between the lengths is different from that described above, an effect similar to that by this embodiment can be obtained.

Figure 7A:
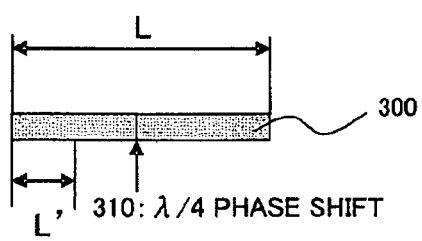
FIG. 7(A) is a view illustrating the overall length of the semiconductor laser according to the first embodiment and the length of regions in the proximity of the opposite end portions of the semiconductor laser.
Figure 7B:
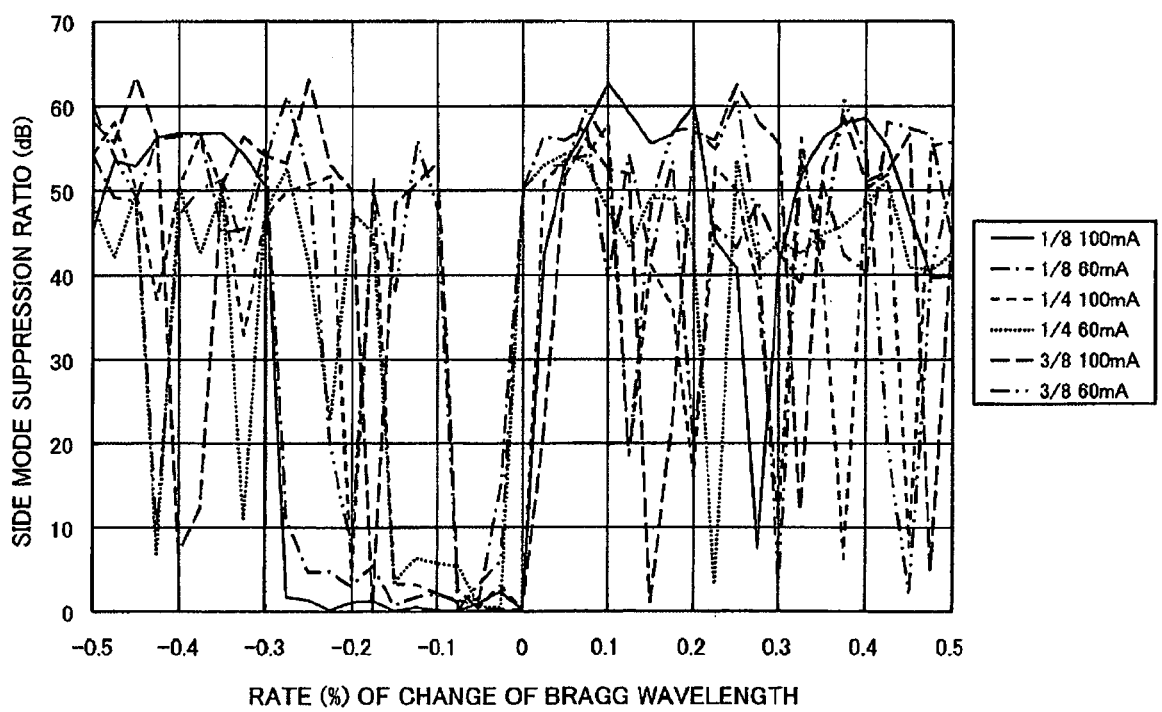
FIG. 7(B) is a view illustrating a relationship between the variation ratio of the Bragg wavelength and the side-mode suppression ratio of the semiconductor laser according to the first embodiment.

Here, FIG. 7(B) illustrates a relationship between the variation ratio (rate of change) (%) of the Bragg wavelength and the higher-mode suppression ratio (side-mode suppression ratio) (dB) where the λ/4 phase shift 310 is provided at the center and the laser length (overall length of the region in which the diffraction grating 300 is provided) is represented by L while the length of the region for varying the Bragg wavelength on one side (the length of the region in which the period of the diffraction grating 300 is long) is represented by L' [refer to FIG. 7(A)]. It is to be noted that the higher-mode suppression ratio represents a single-wavelength characteristic and indicates by what amount the light intensity of the higher-order mode (side mode) is suppressed with respect to the light intensity (photoelectric field intensity) of the fundamental mode.

Figure 8:
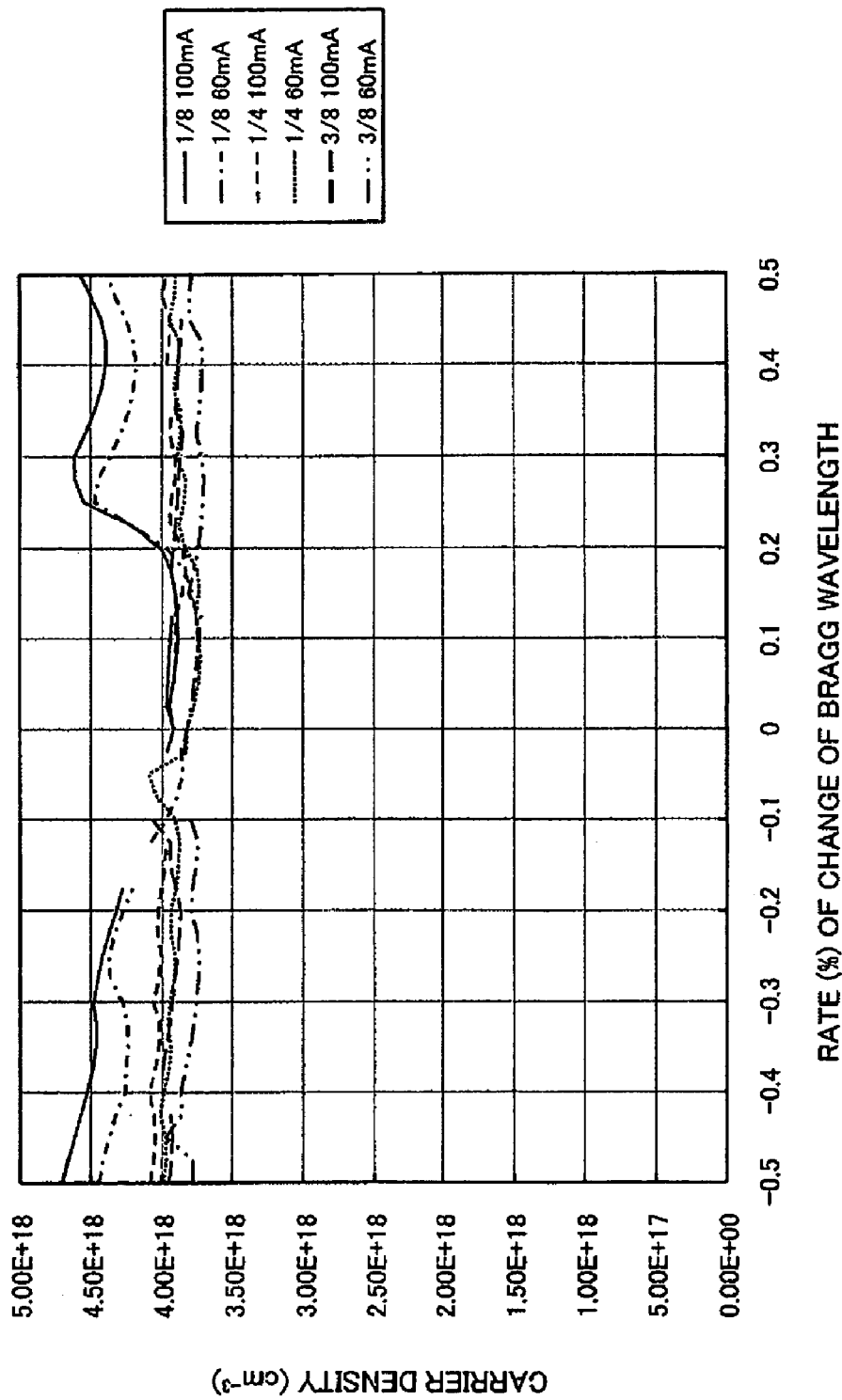
FIG. 8 is a view showing a relationship between the variation ratio of the Bragg wavelength and the carrier density of the semiconductor laser according to the first embodiment.

Further, FIG. 8 illustrates a relationship between the variation ratio (rate of change) (%) of the Bragg wavelength and the carrier density (threshold value carrier density which represents threshold value current) (cm$^{-3}$). It is to be noted here that the laser current value (injection current value) is set to 60 mA and 100 mA.

For example, as seen in FIGS. 7(B) and 8, if both of the lengths of the regions in the proximity of the opposite end portions (regions in which the period of the diffraction grating 300 is long; regions for varying the Bragg wavelength) are within a range from 1/8 to 3/8 of the overall length (laser length) (in particular, if the length of the region in the proximity of one of the end portions is within a range from 1/8 to 3/8 of the overall length), then a semiconductor laser which has excellent single-wavelength stabilization operability and can be operated with a low-threshold value can be implemented. In particular, if the proportion L'/L of the length L' of the region for varying the Bragg wavelength on one side with respect to the laser length L is within the range from 1/8 to 3/8, then a semiconductor laser which has excellent single-wavelength stabilization operability and can be operated with a low-threshold value can be implemented. It is to be noted here that the graphs shown in FIGS. 7(B) and 8 relate to a case wherein the proportion L'/L of the length L' of the region for varying the Bragg wavelength on one side with respect to the laser length L is 1/8, another case wherein the proportion L'/L is 1/4 and further case wherein the proportion L'/L is 3/8.

Further, in this embodiment, while the period of the diffraction grating 300 is varied by 0.05% between the regions in the proximity of the opposite end portions and the region in the proximity of the phase shift 310 to vary the Bragg wavelength by 0.05% as described above, this embodiment is not limited to this. For example, if, in the state in which current injection is not performed for the optical waveguide 200, the Bragg wavelength of the regions in the proximity of the opposite end portions is set so as to be longer within a range from 0.025 to 0.100% than the Bragg wavelength of the region in the proximity of the phase shift 310 (if the variation ratio of the Bragg wavelength is within a range from 0.025 to 0.100%) as seen in FIGS. 7(B) and 8, then the value of the side-mode suppression ratio becomes a desired value (for example, 40 dB or more), and a semiconductor laser which has excellent single-wavelength stabilization operability and can be operated with a low-threshold value can be implemented.

In particular, the period Λ2 of the diffraction grating 300 provided in the regions in the proximity of the opposite end portions is set so as to be longer within a range from 0.025 to 0.100% than the period Λ1 of the diffraction grating 300 provided in the region in the proximity of the phase shift 310, then the Bragg wavelength of the regions in the proximity of the opposite end portions can be set longer within a range from 0.025 to 0.100% than the Bragg wavelength of the region in the proximity of the phase shift 310 in the state in which current injection is not performed for the optical waveguide 200. Consequently, the value of the side-mode suppression ratio becomes a desired value (for example, 40 dB or more), and a semiconductor laser which has excellent single-wavelength stabilization operability and can be operated with a low-threshold value can be implemented.

Second Embodiment

Next, a semiconductor laser according to a second embodiment is described with reference to FIGS. 9 and 10.

A semiconductor laser (semiconductor device) according to this embodiment is different from the semiconductor laser of the first embodiment described above in that, while the period of the diffraction grating 300 in the semiconductor laser of the first embodiment is varied stepwise between the regions in the proximity of the opposite end portions and the region in the proximity of the phase shift 310, the width of the optical waveguide 200 is varied stepwise between the regions in the proximity of the opposite end portions and the region in the proximity of the phase shift 310. It is to be noted that, in this embodiment, like elements to those in the first embodiment (refer to FIG. 3) described above are denoted by like reference characters.

Figure 9:
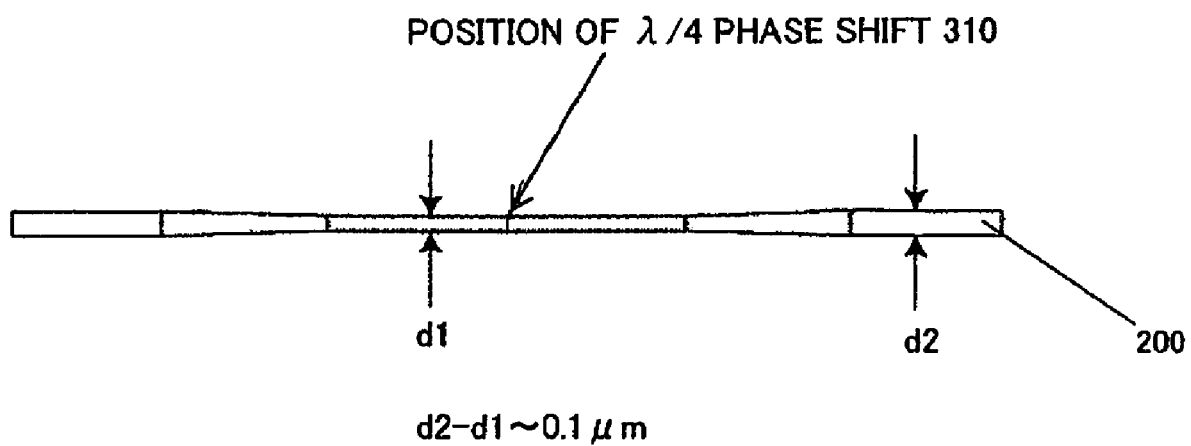
FIG. 9 is a schematic view showing a configuration of essential part of a semiconductor laser according to a second embodiment.

In particular, as shown in FIG. 9, in this semiconductor laser, the width d2 of the optical waveguide 200 provided in the regions in the proximity of the opposite end portions is wider than the width d1 of the optical waveguide 200 provided in the region in the proximity of the phase shift 310.

More particularly, as shown in FIG. 9, the width (waveguide width) d2 of the optical waveguide 200 provided in the regions in the proximity of the opposite end portions is 1.7 μm and the width d1 of the optical waveguide 200 provided in the region in the proximity of the phase shift 310 is 1.6 μm, and the waveguide width d2 is wider by 0.1 μm than the waveguide width d1.

Here, the overall length (device length) of the semiconductor laser is 600 μm and both of the lengths of the regions in the proximity of the opposite end portions (here, the lengths of the regions wherein the width of the optical waveguide 200 is d2; the regions wherein the width of the optical waveguide 200 is wider) are 100 μm from the individual end portions.

Where the waveguide width d2 is wider by 0.1 μm than the waveguide width d1 in this manner, the equivalent refractive index of the optical waveguide 200 provided in the region in the proximity of the phase shift 310 becomes larger (increases equivalently) by 0.05% than the equivalent refractive index of the optical waveguide 200 provided in the region in the proximity of the phase shift 310. In other words, in the state in which current injection is not performed for the optical waveguide 200, the Bragg wavelength of the regions in the proximity of the opposite end portions (the opposite end portions of the device; the opposite end portions of the resonator) (in the regions having the desired length from one of the end portions) becomes greater by 0.05% than the Bragg wavelength of the region in the proximity of the phase shift 310 (region adjacent to the phase shift 310).

In the semiconductor laser configured in such a manner as described above, similarly as in the case of the first embodiment described above (refer to FIG. 6), also where the injection current value is increased to increase the light intensity in order so that a desired optical output may be obtained, multimode oscillation does not occur and stabilized single-wavelength oscillation (single-mode oscillation) is obtained. It is to be noted that, in this case, the threshold value is similar to that of a normal phase shift DFB laser and low-threshold value operation can be implemented.

It is to be noted that, since details of the configuration of the other portions and so forth are same as those in the first embodiment described above, description of them is omitted here.

Accordingly, with the semiconductor laser according to this embodiment, there is an advantage that, similarly as in the first embodiment described above, also where the injection current value is increased so that a desired optical output is obtained, stabilized single-wavelength operation and stabilized low-threshold value operation can be implemented.

It is to be noted that, while, in this embodiment, the device length is set to 600 μm and the length of the regions wherein the width of the optical waveguide 200 is wide (regions in the proximity of the opposite end portions) is set to 100 μm as described above, this embodiment is not limited to this. For example, even if the device length and the region length are different from those given above or the ratio between the lengths is different from that given above, an effect similar to that achieved by this embodiment can be achieved.

For example, if both of the lengths of the regions in the proximity of the opposite end portions (the regions wherein the width of the optical waveguide 200 is wider; regions for varying the Bragg wavelength) are within a range from ⅛ to ⅜ of the overall length (laser length) (in particular, if the length of the region in the proximity of one of the end portions is within a range from ⅛ to ⅜ of the overall length), then the semiconductor laser which has excellent single-wavelength stabilization operability and can be operated with a low-threshold value can be implemented [refer to FIGS. 7(B) and 8].

Further, while, in this embodiment, the width of the optical waveguide 200 is varied by 0.1 μm between the regions in the proximity of the opposite end portions and the region in the proximity of the phase shift 310 so that the Bragg wavelength is varied by 0.05% as described above, this embodiment is not limited to this. For example, similarly as in the first embodiment described above, if, in the state in which current injection is not performed for the optical waveguide 200, the Bragg wavelength of the regions in the proximity of the opposite end portions is set so as to be longer within a range from 0.025 to 0.100% than the Bragg wavelength of the region in the proximity of the phase shift 310 (if the variation ratio of the Bragg wavelength is within a range from 0.025 to 0.100%), then a semiconductor laser which has excellent single-wavelength stabilization operability and can be operated with a low-threshold value can be implemented [refer to FIGS. 7(B) and 8].

Figure 10:
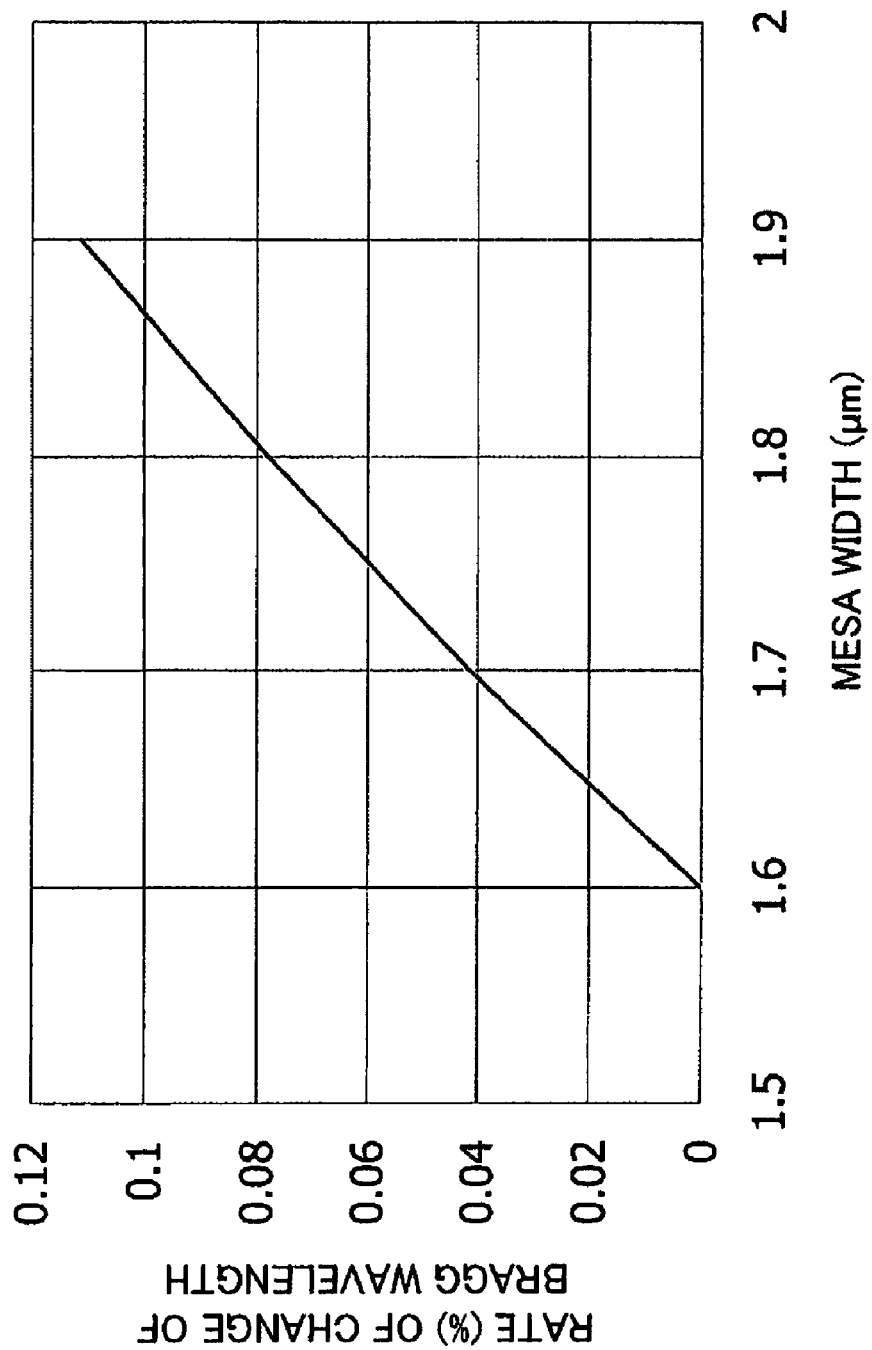
FIG. 10 is a view illustrating a relationship between the waveguide width (mesa width) and the variation ratio of the Bragg wavelength of the semiconductor laser according to the second embodiment.

Here, FIG. 10 illustrates a relationship between the variation ratio (rate of change) (%) of the Bragg wavelength and the width of the optical waveguide 200 (waveguide width; mesa width) (μm).

As seen in FIG. 10, where the waveguide width is varied within a range from 0.05 to 0.25 μm with respect to an optical waveguide having the width of 1.6 μm, the variation ratio of the Bragg wavelength is within a range from 0.025 to 0.100%.

Therefore, if the width of the optical waveguide 200 is varied within the range from 0.05 to 0.25 μm between the regions in the proximity of the opposite end portions and the region in the proximity of the phase shift 310, then the Bragg wavelength of the regions in the proximity of the opposite end portions can be determined longer within a range from 0.025 to 0.100% than the Bragg wavelength of the region in the proximity of the phase shift 310 in the state in which current injection is not performed for the optical waveguide 200. Consequently, a semiconductor laser which has excellent single-wavelength stabilization operability and can be operated with a low-threshold value can be implemented [refer to FIGS. 7(B) and 8].

In particular, if the width of the optical waveguide 200 provided in the regions in the proximity of the opposite end portions is set so as to be wider within a range from 0.05 to 0.25 μm than the width of the optical waveguide 200 provided in the region in the proximity of the phase shift 310, then the equivalent refractive index of the optical waveguide 200 provided in the regions in the proximity of the opposite end portions becomes larger within a range from 0.025 to 0.100% than the equivalent refractive index of the optical waveguide 200 provided in the region in the proximity of the phase shift 310 in the state in which current injection is not performed for the optical waveguide 200. As a result, the Bragg wavelength of the regions in the proximity of the opposite end portions can be set longer within a range from 0.025 to 0.100% than the Bragg wavelength of the region in the proximity of the phase shift 310 in the state in which current injection is not performed for the optical waveguide 200. Consequently, a semiconductor laser which has excellent single-wavelength stabilization operability and can be operated with a low-threshold value can be implemented [refer to FIGS. 7(B) and 8].

Third Embodiment

Next, a semiconductor laser according to a third embodiment is described with reference to FIG. 11.

A semiconductor laser (semiconductor device) according to this embodiment is different from those in the first and second embodiments described above in that it is a tunable laser whose oscillation wavelength can be varied.

Figure 11:
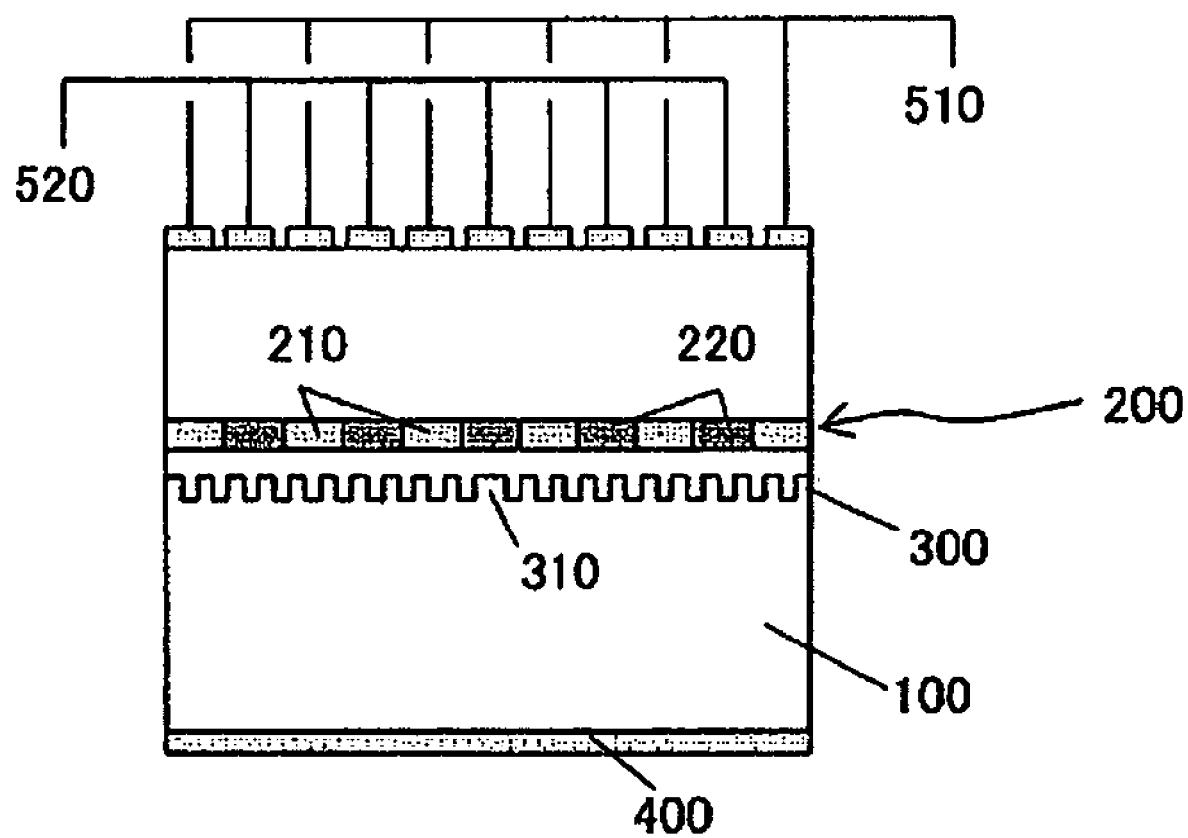
FIG. 11 is a schematic sectional view showing a configuration of a semiconductor laser according to a third embodiment.

In particular, as shown in FIG. 11, in this semiconductor laser, the optical waveguide 200 includes gain waveguide portions (for example, including a waveguide core layer formed from a multiple quantum well structure of GaInAsP) 210 capable of generating gain by current injection and wavelength controlling waveguide portions (transparent waveguide portion; for example, including a waveguide core layer formed from a semiconductor material such as GaInAsP whose refractive index is varied by current injection) 220 capable of controlling the oscillation wavelength of the laser by variation of the refractive index thereof by current injection. The gain waveguide portions and the wavelength controlling waveguide portions are provided alternately in the direction of an optical axis. More particularly, the optical waveguide 200 is configured such that the gain waveguide portions 210 and the wavelength controlling waveguide portions 220 are arranged periodically. It is to be noted here that the gain waveguide portions 210 are provided at the opposite end portions of the optical wave guide 200. Further, in FIG. 11, like elements to those of the first embodiment (refer to FIG. 3) described above are denoted by like reference characters.

Here, the wavelength controlling waveguide portion 220 is configured using a semiconductor material such as, for example, GaInAsP whose refractive index varies by current injection so that the refractive index thereof is varied by current injection.

Further, as shown in FIG. 11, an electrode 510 for injecting current to the gain waveguide portions 210 is provided above the gain waveguide portions 210. Further, as shown in FIG. 11, an electrode 520 for injecting current to the wavelength controlling waveguide portion 220 is provided above the wavelength controlling waveguide portions 220. It is to be noted that an electrode 400 is provided at a lower portion of the semiconductor substrate 100.

It is to be noted that, while the wavelength controlling waveguide portions 220 are configured such that the refractive index thereof is varied by current injection in this embodiment, this embodiment is not limited to this. For example, the wavelength controlling waveguide portions 220 may be made of a semiconductor material whose refractive index is varied by applying a reverse bias voltage (by voltage application) so that the refractive index thereof is varied by application of a reverse bias voltage (by voltage application). In this case, although the amount of wavelength shift is small because the amount of the refractive index change is small, the oscillation wavelength can be varied at a high speed.

Further, in this embodiment, similarly as in the second embodiment described above (refer to FIG. 9), the width d2 of the optical waveguide 200 provided in the regions in the proximity of the opposite end portions is wider than the width d1 of the optical waveguide 200 provided in the region in the proximity of the phase shift 310.

In particular, similarly as in the second embodiment described above (refer to FIG. 9), the width (waveguide width) d2 of the optical waveguide 200 provided in the regions in the proximity of the opposite end portions is 1.7 μm and the width d1 of the optical waveguide 200 provided in the region in the proximity of the phase shift 310 is 1.6 μm, and the waveguide width d2 is wider by 0.1 μm than the waveguide width d1.

Here, the overall length (device length) of the semiconductor laser is 600 μm and both of the lengths of the regions in the proximity of the opposite end portions (here, the lengths of the regions wherein the width of the optical waveguide 200 is d2; the regions wherein the width of the optical waveguide 200 is wider) are 100 μm from the individual end portions.

Where the waveguide width d2 is wider by 0.1 μm than the waveguide width d1 in this manner, the equivalent refractive index of the optical waveguide 200 provided in the regions in the proximity of the opposite end portions becomes larger (increases equivalently) by 0.05% than the equivalent refractive index of the optical waveguide 200 provided in the region in the proximity of the phase shift 310. In particular, in the state in which current injection is not performed for the optical waveguide 200, the Bragg wavelength of the regions in the proximity of the opposite end portions (the opposite end portions of the device; the opposite end portions of the resonator) (of the regions having the desired length from one of the end portions) becomes greater by 0.05% than the Bragg wavelength of the region in the proximity of the phase shift 310 (region adjacent to the phase shift 310).

In the semiconductor laser configured in such a manner as described above, similarly as in the case of the first embodiment described above (refer to FIG. 6), also where the injection current value is increased to increase the light intensity in order so that a desired optical output may be obtained, multi-mode oscillation does not occur and stabilized single-wavelength oscillation (single-mode oscillation) is obtained. It is to be noted that, in this case, the threshold value is similar to that of a normal phase shift DFB laser and low-threshold value operation can be implemented.

It is to be noted that, since details of the configuration of the other portions and so forth are same as those in the first and second embodiments described above, description of them is omitted herein.

Accordingly, with the semiconductor laser according to this embodiment, there is an advantage that, similarly as in the first embodiment described above, also where the injection current value is increased so that a desired optical output is obtained, stabilized single-wavelength operation and stabilized low-threshold value operation can be implemented.

It is to be noted that, while, in this embodiment, the device length is set to 600 μm and the length of the region wherein the width of the optical waveguide 200 is wide (of the regions in the proximity of the opposite end portions) is set to 100 μm as described above, this embodiment is not limited to this. For example, even if the device length and the region length are different from those just described or the ratio between the lengths is different from that described above, an effect similar to that achieved by this embodiment can be achieved.

For example, if both of the lengths of the regions in the proximity of the opposite end portions (regions in which the width of the optical waveguide 200 is wide; regions for varying the Bragg wavelength) are within a range from ⅛ to ⅜ of the overall length (laser length) (in particular, if the length of the region in the proximity of one of the end portions is within a range from ⅛ to ⅜ of the overall length), then a semiconductor laser which has excellent single-wavelength stabilization operability and can be operated with a low-threshold value can be implemented [refer to FIGS. 7(B) and 8].

Further, while, in this embodiment, the width of the optical waveguide 200 is varied by 0.1 μm between the regions in the proximity of the opposite end portions and the region in the proximity of the phase shift 310 so that the Bragg wavelength is varied by 0.05% as described above, this embodiment is not limited to this. For example, similarly as in the first embodiment described above, if, in the state in which current injection is not performed for the optical waveguide 200, the Bragg wavelength of the regions in the proximity of the opposite end portions is set so as to be longer within a range from 0.025 to 0.100% than the Bragg wavelength of the region in the proximity of the phase shift 310 (if the variation ratio of the Bragg wavelength is within a range from 0.025 to 0.100%), then a semiconductor laser which has excellent single-wavelength stabilization operability and can be operated with a low-threshold value can be implemented [refer to FIGS. 7(B) and 8].

As described in the second embodiment described above with reference to FIG. 10, where the waveguide width is varied within a range from 0.05 to 0.25 μm with respect to an optical waveguide having the width of 1.6 μm, the variation ratio of the Bragg wavelength is within a range from 0.025 to 0.100%.

Therefore, if the width of the optical waveguide 200 is varied within the range from 0.05 to 0.25 μm between the regions in the proximity of the opposite end portions and the region in the proximity of the phase shift 310, then the Bragg wavelength of the regions in the proximity of the opposite end portions can be set longer within a range from 0.025 to 0.100% than the Bragg wavelength of the region in the proximity of the phase shift 310 in the state in which current injection is not performed for the optical waveguide 200. Consequently, a semiconductor laser which has excellent single-wavelength stabilization operability and can be operated with a low-threshold value can be implemented [refer to FIGS. 7(B) and 8].

In particular, if the width of the optical waveguide 200 provided in the regions in the proximity of the opposite end portions is set so as to be wider within a range from 0.05 to 0.25 μm than the width of the optical waveguide 200 provided in the region in the proximity of the phase shift 310, then the equivalent refractive index of the optical waveguide 200 provided in the regions in the proximity of the opposite end portions becomes larger within a range from 0.025 to 0.100% than the equivalent refractive index of the optical waveguide 200 provided in the region in the proximity of the phase shift 310 in the state in which current injection is not performed for the optical waveguide 200. As a result, the Bragg wavelength of the regions in the proximity of the opposite end portions can be determined longer within a range from 0.025 to 0.100% than the Bragg wavelength of the region in the proximity of the phase shift 310 in the state in which current injection is not performed for the optical waveguide 200. Consequently, a semiconductor laser which has excellent single-wavelength stabilization operability and can be operated with a low-threshold value can be implemented [refer to FIGS. 7(B) and 8].

[Others]

It is to be noted that, while the semiconductor substrate 100 is formed from an n-type InP substrate in the embodiments described above, these embodiments are not limited to these. For example, a p-type InP substrate or a semi-insulating InP substrate (SI-InP substrate) may be used for the semiconductor substrate 100, or a different semiconductor substrate such as, for example, a GaAs substrate, a GaN substrate or the like may be used for the semiconductor substrate 100. However, by using an InP substrate, a semiconductor laser for generating light having a wavelength band to be used for optical communication is obtained, and, by using an n-type substrate, a semiconductor laser which has an excellent electrical characteristic and can be produced easily is obtained.

Further, while one λ/4 phase shift 310 is provided at the central portion of the diffraction grating 300 in the embodiments described above, these embodiments are not limited to these. For example, the phase shift may be provided at least at one portion in the inside of the diffraction grating.

In particular, while the λ/4 phase shift whose phase shift amount is a ¼ wavelength is provided at one portion, these embodiments are not limited to these, and, for example, a λ/8 phase shift whose phase shift amount is a ⅛ wavelength, a 3λ/8 phase shift whose phase shift amount is a ⅜ wavelength or the like may be used or a phase shift may be provided at a plurality of portions. However, by using the λ/4 phase shift whose phase shift amount is a ¼ wavelength, characteristics such as wavelength stability, a threshold value and so forth are placed into the best state.

Further, the phase shift need not necessarily be provided at the center. For example, if the movement amount is within a range of the length of approximately 10% of the resonator length, then the phase shift may be moved in left and right directions from the central position. In this case, while the single-wavelength stability is degraded a little, a greater optical output can be obtained.

Also in this case, similarly as in the embodiments described above, only if the semiconductor laser is configured such that the Bragg wavelength of the regions in the proximity of the opposite end portions (the opposite end portions of the device; the opposite end portions of the resonator) (of the regions having the desired length from the end portions) is greater than the Bragg wavelength of the region in the proximity of the phase shift 310 (region adjacent to the phase shift 310) in the state in which current injection is not performed for the optical waveguide 200. It is to be noted that whether or not a semiconductor device is a semiconductor laser having such a configuration as described above can be decided by observing transmission and reflection spectrums in the regions in the proximity of the opposite end portions and the region in the proximity of the phase shift.

For example, where the phase shift is provided at two portions (where, in the case wherein the device length is represented by L, the phase shift is provided individually at portions of L/4 from individual end portions), the semiconductor laser may be configured such that the Bragg wavelength in the regions in the proximity of the opposite end portions of the region in which the diffraction grating is provided (the opposite end portions of the device; the opposite end portions of the resonator) and the Bragg wavelengths at the center and in the region in the proximity of the center are longer than the Bragg wavelength in the region in the proximity of the phase shift in the state in which current injection is not performed for the optical waveguide.

Further, while, in the embodiments described above, the period of the diffraction grating 300 or the width of the optical waveguide 200 is varied between the regions in the proximity of the opposite end portions and the region in the proximity of the phase shift 310 so that the Bragg wavelength is varied, these embodiments are not limited to these. For example, the thickness or the composition of the optical waveguide may be varied between the regions in the proximity of the opposite end portions and the region in the proximity of the phase shift (that is, the equivalent refractive index of the optical waveguide is varied) so that the Bragg wavelength is varied, and, also in this case, an effect similar to that of the embodiments described above is obtained.

Figure 12:
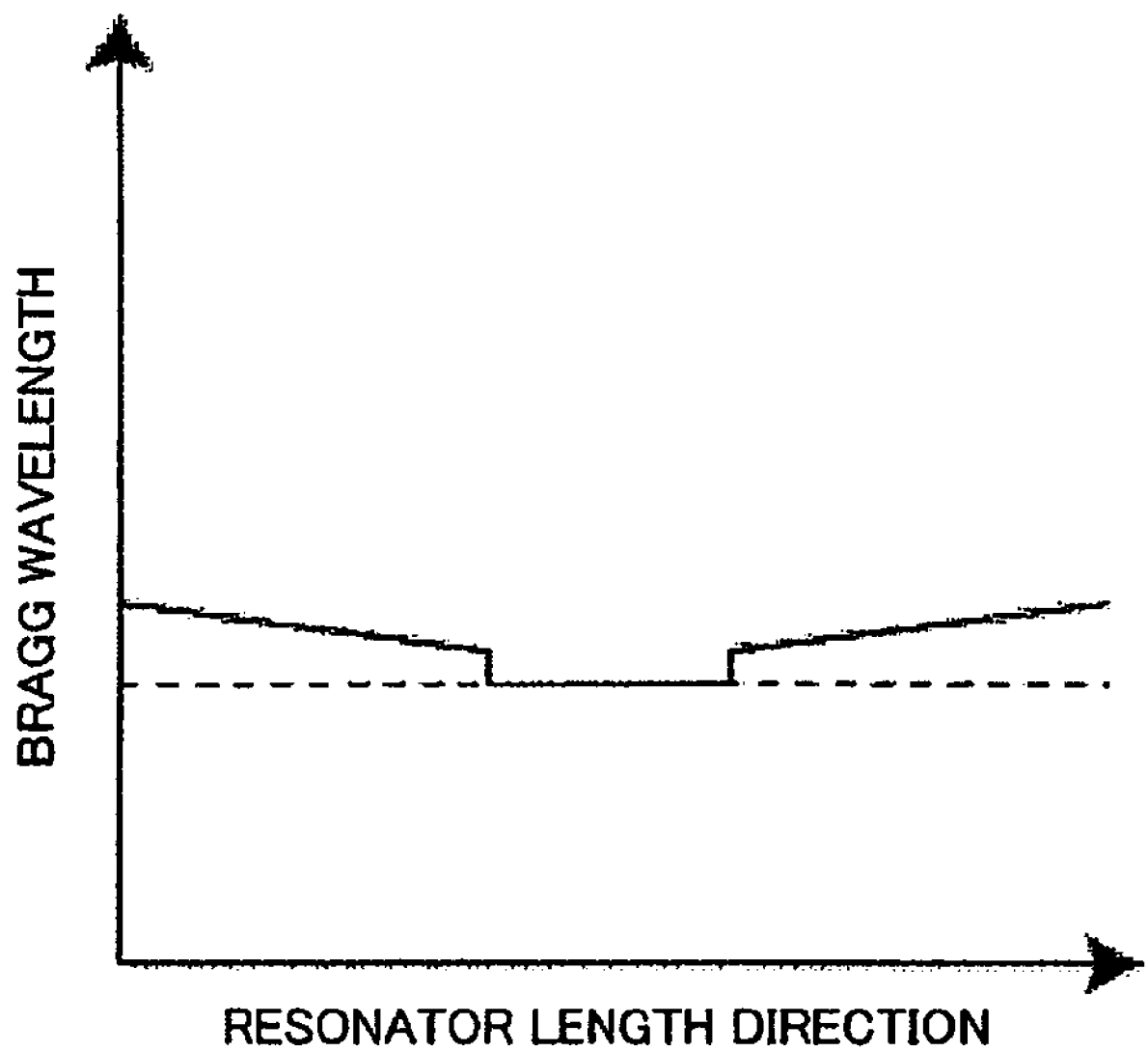
FIG. 12 is a view showing a Bragg wavelength in a state in which current injection to a semiconductor laser according to a modification to the embodiments is not performed.

Further, while, in the embodiments described above, the semiconductor laser is configured such that the Bragg wavelength varies stepwise between the regions in the proximity of the opposite end portions and the region in the proximity of the phase shift 310 in the state in which current injection is not performed for the optical waveguide 200, these embodiments are not limited to these. For example, as shown in FIG. 12, the semiconductor laser may be configured such that the Bragg wavelength is varied continuously from the region in the proximity of the phase shift toward the opposite end portions (device end portions) (that is, the Bragg wavelength becomes long gradually), and, also in this case, an effect similar to that of the embodiments described above is obtained [refer to FIGS. 7(B) and 8].

For example, the semiconductor laser may be configured such that, in the state in which the current injection is not performed for the optical waveguide, the product between the proportion of the length of the region, in which the Bragg wavelength is varied, within a region from the central portion to one of the opposite end portions with respect to the laser length (overall length; resonator length; device length) and an average value of variation ratios (rate of change) of the Bragg wavelength in the region, in which the Bragg wavelength is varied, is within a range of 0.003125 to 0.037500%.

Here, as described in the embodiments described above, it is known that, if both of the lengths of the regions in the proximity of the opposite end portions are individually set to a length within a range from ⅛ to ⅜ of the laser length and the Bragg wavelength in the regions in the proximity of the opposite end portions is set so as to be longer within a range from 0.025 to 0.100% than the Bragg wavelength in the region in the proximity of the phase shift, then a semiconductor laser which has excellent single-wavelength stabilization operability and can be operated with a low-threshold value can be implemented. Therefore, it is considered that, if the product between the proportion of the length of the regions in the proximity of the opposite end portions and the average value of the variation ratio of the Bragg wavelength is within a range from 0.025%×⅛ to 0.100%×⅜, that is, within a range from 0.003125 to 0.037500%, then a semiconductor laser which has excellent single-wavelength stabilization operability and can be operated with a low-threshold value can be implemented, and the value range described above is determined with the foregoing taken into consideration.

It is to be noted here that, since the value range is determined based on the length of the regions in the proximity of the opposite end portions, it seems that a case is assumed wherein the Bragg wavelength is continuously varied in the regions in the proximity of the opposite end portions. However, in addition to such a case as described above, also in the state in which the Bragg wavelength is continuously varied over the overall length of the laser (that is, over the overall length of the region on one side from the central portion to one of the opposite end portions), if the semiconductor laser is configured such that the product between the proportion of the length of the region, in which the Bragg wavelength is varied, within a region from the central portion to one of the opposite end portions with respect to the laser length (overall length; resonator length; device length) and an average value of variation ratios of the Bragg wavelength in the region, in which the Bragg wavelength is varied, is within a range of 0.003125 to 0.037500%, then a semiconductor laser which has excellent single-wavelength stabilization operability and can be operated with a low-threshold value can be implemented.

Figure 13:
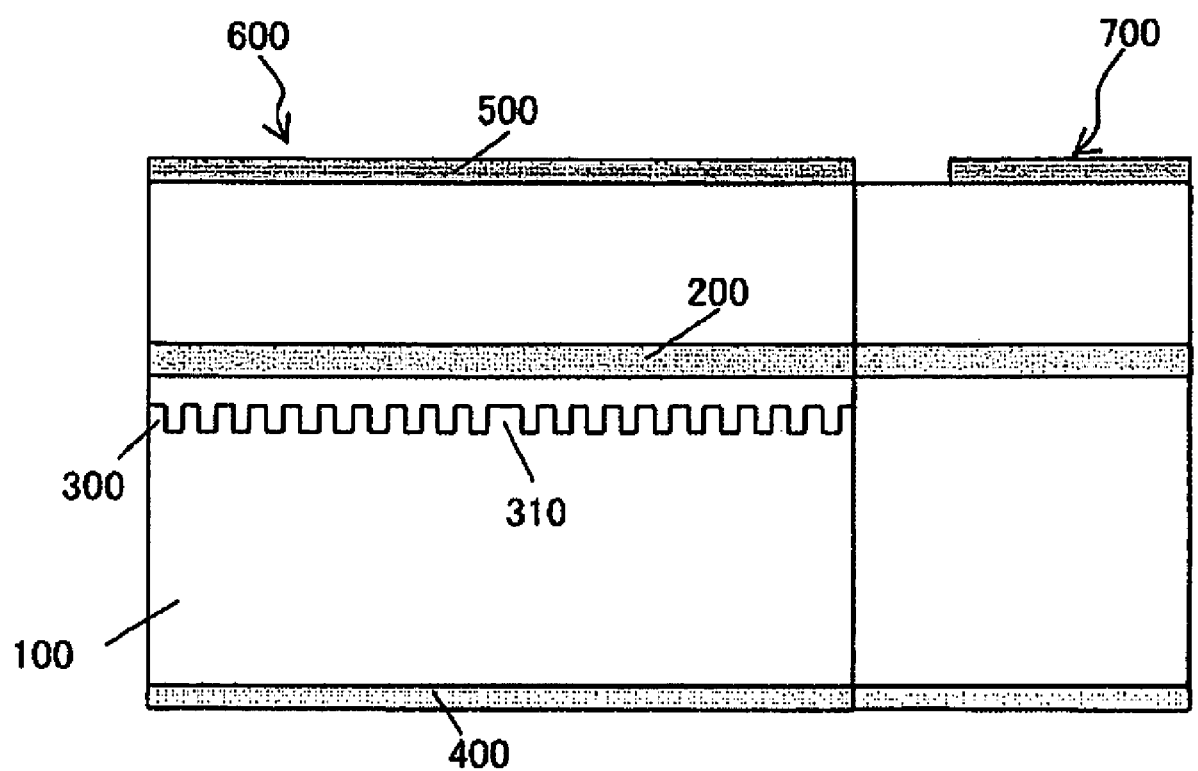
FIG. 13 is a schematic sectional view showing a configuration of a semiconductor optical integrated device including the semiconductor laser according to the embodiments.

Further, while, in the embodiments described above, description is given taking a single semiconductor laser as an example, these embodiments are not limited to these. For example, as shown in FIG. 13, also it is possible to integrate the semiconductor laser 600 in the embodiments described above and a different optical functional device (for example, an optical modulator or an optical amplifier) 700 to configure a semiconductor optical integrated device, and, also in this case, an effect similar to that of the embodiments described above is obtained. In particular, also the semiconductor optical integrated device can be configured as a device including at least one optical functional device optically coupled with the semiconductor laser provided on the semiconductor substrate (same semiconductor substrate) on which the semiconductor laser in the embodiments described above is formed, and, also in this case, an effect similar to that of the embodiments described above is obtained.

The present invention is not limited to the embodiment specifically described above, and variations and modifications can be made without departing from the scope of the present invention.

What is claimed is:

1. A semiconductor laser, comprising:
an optical waveguide formed over a semiconductor substrate and capable of generating gain by current injection; and
a diffraction grating having a phase shift and provided along said optical waveguide over an overall length of said optical waveguide over the semiconductor substrate;
wherein said semiconductor laser is configured such that a Bragg wavelength in a region in a proximity of each of opposite ends of said optical waveguide is longer within a range from 0.025% to 0.100% than a Bragg wavelength in a region in a proximity of the phase shift in a state in which current injection is not performed for said optical waveguide.

2. The semiconductor laser as claimed in claim 1, wherein, in the state in which current injection is not performed for said optical waveguide, said semiconductor laser is configured such that the Bragg wavelength varies stepwise.

3. The semiconductor laser as claimed in claim 1, wherein a period of said diffraction grating provided in the region in the proximity of each of the opposite ends of said optical waveguide is longer within a range from 0.025 to 0.100% than a period of said diffraction grating provided in the region in the proximity of the phase shift.

4. The semiconductor laser as claimed in claim 1, wherein an equivalent refractive index of said optical waveguide provided in the region in the proximity of each of the opposite ends of said optical waveguide is larger within a range from 0.025 to 0.100% than an equivalent refractive index of said optical waveguide provided in the region in the proximity of the phase shift.

5. The semiconductor laser as claimed in claim 1, wherein a width of said optical waveguide provided in the region in the proximity of each of the opposite ends of said optical waveguide is wider within a range from 0.05 to 0.25 μm than a width of said optical waveguide provided in the region in the proximity of the phase shift.

6. The semiconductor laser as claimed in claim 1, wherein a length of the region in the proximity of one of the opposite ends of said optical waveguide is within a range from ⅛ to ⅜ of the overall length.

7. The semiconductor laser as claimed in claim 1, wherein, in the state in which current injection is not performed for said optical waveguide, said semiconductor laser is configured such that the Bragg wavelength varies continuously from a phase shift side toward an end side of said optical waveguide in the region in the proximity of each of the opposite ends of said optical waveguide.

8. A semiconductor laser, comprising:

an optical waveguide formed over a semiconductor substrate and capable of generating gain by current injection; and a diffraction grating having a phase shift and provided along said optical waveguide over an overall length of said optical waveguide over the semiconductor substrate;

wherein, in a state in which current injection is not performed for said optical waveguide, said semiconductor laser is configured such that a Bragg wavelength varies continuously from the phase shift to each of opposite ends of said optical waveguide, the Bragg wavelength in a proximity of each of the opposite ends of said optical waveguide is longer than the Bragg wavelength in a proximity of the phase shift, and a product between a proportion L'/L and an average value of a rate of change of the Bragg wavelength in a region from the phase shift to one of the opposite ends of said optical waveguide is within a range from 0.003125% to 0.037500%, where L' is a length of the region from the phase shift to one of the opposite ends of said optical waveguide, and L is the overall length of said optical waveguide.

9. The semiconductor laser as claimed in claim 1, wherein the semiconductor substrate is an InP substrate.

10. The semiconductor laser as claimed in claim 1, wherein the phase shift is provided at one portion and an amount of phase shift is a ¼ wavelength.

11. The semiconductor laser as claimed in claim 10, wherein the phase shift is provided at a center of said diffraction grating.

12. The semiconductor laser as claimed in claim 1, wherein said optical waveguide includes a gain waveguide portion capable of generating gain by current injection and a wavelength controlling waveguide portion capable of controlling an oscillation wavelength by current injection or voltage application, the gain waveguide portion and wavelength controlling waveguide portion being provided alternately in a direction of an optical axis.

13. The semiconductor laser as claimed in claim 12, wherein said wavelength controlling waveguide portion is configured such that a refractive index thereof is varied by current injection.

14. The semiconductor laser as claimed in claim 12, wherein the wavelength controlling waveguide portion is configured such that a refractive index thereof is varied by applying a reverse bias voltage.

15. A semiconductor optical integrated device, comprising:

a semiconductor laser including an optical waveguide formed over a semiconductor substrate and capable of generating gain by current injection, and a diffraction grating having a phase shift and provided along said optical waveguide over an overall length of said optical waveguide over the semiconductor substrate, wherein said semiconductor laser is configured such that a Bragg wavelength in a region in a proximity of each of opposite ends of said optical waveguide is longer within a range from 0.025% to 0.100% than a Bragg wavelength in a region in a proximity of the phase shift in a state in which current injection is not performed for said optical waveguide; and an optical functional device provided on the semiconductor substrate on which said semiconductor laser is formed and optically coupled to said semiconductor laser.

16. The semiconductor optical integrated device as claimed in claim 15, wherein, in the state in which current injection is not performed for said optical waveguide, said semiconductor laser is configured such that the Bragg wavelength varies stepwise.

17. The semiconductor optical integrated device as claimed in claim 15, wherein a period of said diffraction grating provided in the region in the proximity of each of the opposite ends of said optical waveguide is longer within a range from 0.025 to 0.100% than a period of said diffraction grating provided in the region in the proximity of the phase shift.

18. The semiconductor optical integrated device as claimed in claim 15, wherein an equivalent refractive index of said optical waveguide provided in the region in the proximity of each of the opposite ends of said optical waveguide is larger within a range from 0.025% to 0.100% than an equivalent refractive index of said optical waveguide provided in the region in the proximity of the phase shift.

* * * * *